United States Patent
Shouno

[19]

[11] Patent Number: 5,901,080
[45] Date of Patent: May 4, 1999

[54] NONVOLATILE SEMICONDUCTOR MEMORY DEVICE

[75] Inventor: Naoki Shouno, Oita, Japan

[73] Assignee: Kabushiki Kaisha Toshiba, Kawasaki, Japan

[21] Appl. No.: 08/967,264

[22] Filed: Nov. 7, 1997

Related U.S. Application Data

[63] Continuation of application No. 08/720,008, Sep. 27, 1996, abandoned.

[30] Foreign Application Priority Data

Sep. 29, 1995 [JP] Japan .................................... 7-253402

[51] Int. Cl.$^6$ .................................................. G11C 16/06
[52] U.S. Cl. .................... 365/185.09; 365/200; 365/201; 365/185.29; 365/185.18
[58] Field of Search ........................ 365/185.09, 185.29, 365/201, 185.18, 200, 185.3

[56] References Cited

U.S. PATENT DOCUMENTS

| | | | |
|---|---|---|---|
| 5,086,413 | 2/1992 | Tsuboi et al. ........................ | 365/185.29 |
| 5,406,521 | 4/1995 | Hideki Hara ................... | 365/185.29 X |
| 5,420,822 | 5/1995 | Kato et al. ............................ | 365/185.2 |
| 5,467,306 | 11/1995 | Kaya et al. ..................... | 365/185.18 X |
| 5,561,635 | 10/1996 | Tada et al. ............................... | 365/201 |
| 5,576,992 | 11/1996 | Mehrad ................................ | 365/185.3 |
| 5,590,075 | 12/1996 | Mazzali ................................... | 365/201 |

Primary Examiner—Huan Hoang
Attorney, Agent, or Firm—Finnegan, Henderson, Farabow, Garrett & Dunner, L.L.P.

[57] ABSTRACT

A nonvolatile semiconductor memory device for storing data by introducing electrons into a floating gate through a tunneling oxide film under an electric field of a control gate includes a switching circuit for supplying a reference high voltage during a normal erase mode and a test bias voltage during a test mode. In the test mode, the switching circuit can create a status where a self-field is applied between the floating gate and the source, and makes it easy to find out cells that are deteriorated due to trapping of holes into the oxide film.

4 Claims, 3 Drawing Sheets

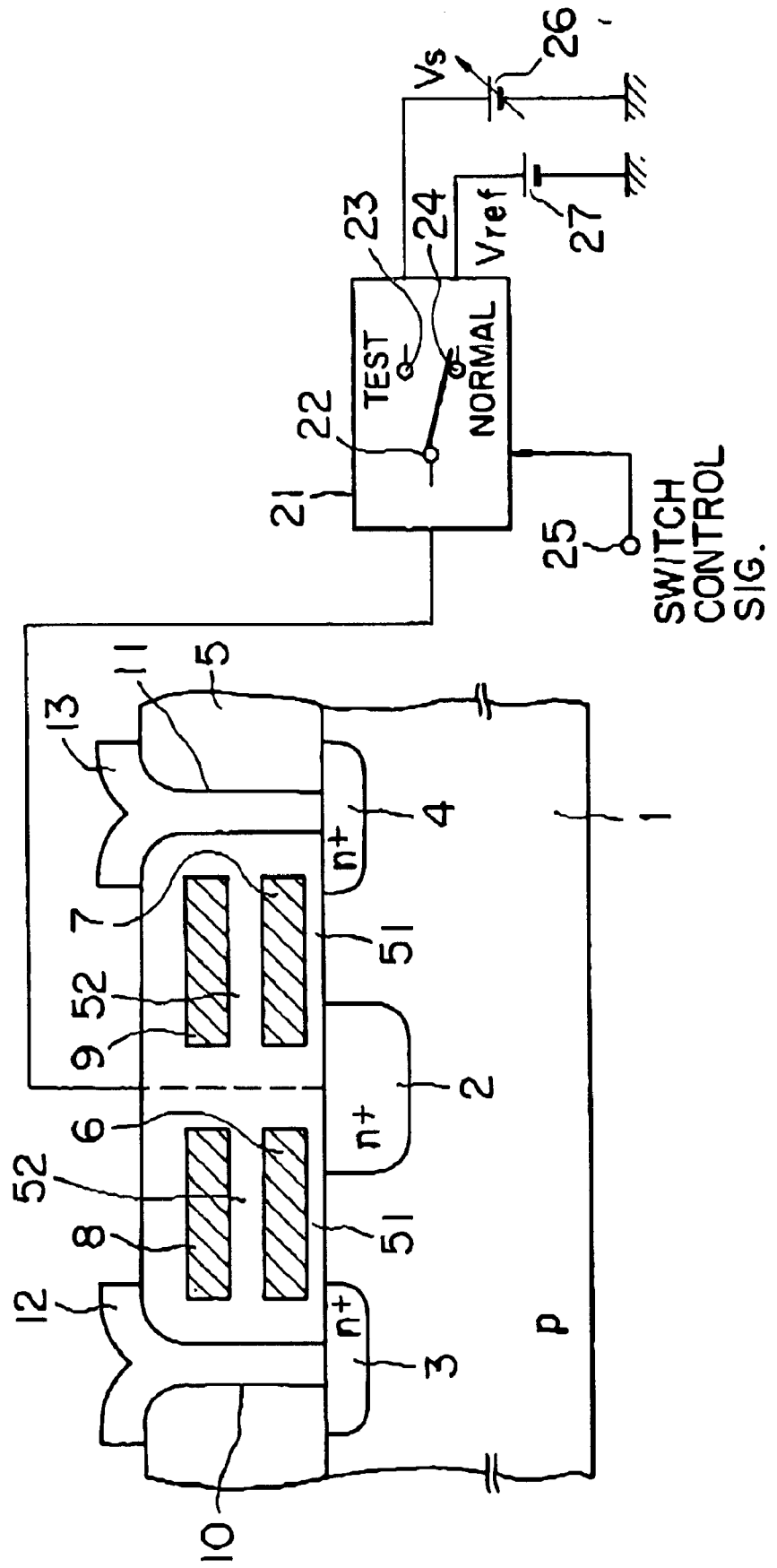
F I G. 1

NO HOLE TRAP

HOLE TRAP EXISTS

NONVOLATILE SEMICONDUCTOR MEMORY DEVICE

This Application is a continuation of application Ser. No. 08/720,008, filed Sep. 27, 1996, now abandoned.

BACKGROUND OF THE INVENTION

This invention relates to a nonvolatile semiconductor memory device in form of an electrically erasable and programmable nonvolatile memory (EEPROM).

An electrically erasable and programmable nonvolatile memory has floating gates and control gates stacked on channels with disposing an insulating film therebetween. Writing of data is effected by applying a high voltage to a control gate and a drain to thereby introduce hot electrons into a floating gate. Erasure of data is effected by applying a high voltage while setting the voltage of the control gates to a ground or negative voltage to thereby generate a tunneling current that removes electrons from the floating gates.

In a conventional EEPROM, while writing/erasure (hereinafter abbreviated to W/E) is repeated, since a high voltage is applied to the source upon erasure, holes are generated around the source due to band-to-band tunneling and also within the tunneling oxide film due to impact ionization of electrons flowing with the tunneling current. FIG. 3A shows an aspect of the oxide film barrier between a floating gate (FG) and a source at the time when no hole trap exists in the oxide film. FIG. 3B shows as aspect of the barrier at the time when hole traps exist in the oxide film. As shown in these figures, when holes are captured into the oxide film, the height of the oxide film barrier becomes low and liable to cause a tunneling phenomenon. Therefore, when a long time passes after data is written (i.e. after electrons are injected into the floating gate), cells become liable to lose data (electrons slip out from the floating gate) due to tunneling caused by a self-field of some MV/cm applied between the floating gate and the source.

SUMMARY OF THE INVENTION

It is therefore an object of the invention to provide an electrically programmable and erasable nonvolatile semiconductor memory device that can detect cells whose floating gates lost electrons due to a self-field, and therefore has a high reliability.

According to the invention, there is provided a nonvolatile semiconductor memory device capable of electrical writing and erasure, comprising:

a source region and a drain region formed on a front surface of a substrate at locations isolated by a channel region;

a floating gate formed above said channel region via a thin oxide film;

a control gate formed above said floating gate via an insulation film; and a switching circuit for supplying said source with a reference high voltage during a normal erase mode or a test bias voltage during a test mode;

said device during said test mode creating a status where a self-field is applied between said floating gate and said source to makes it easy to find out cells that are deteriorated due to trapping of holes in said oxide film.

In this device, defective cells that captured holes in its tunneling oxide film during repeated write and erase operations and became liable to lose electrons from floating gates due to tunneling can be rejected in a short time by applying a voltage to sources or to a semiconductor substrate and accelerating the slip-out of electrons.

BRIEF DESCRIPTION OF THE DRAWINGS

FIG. 1 is an explanatory diagram showing a construction of a semiconductor memory device according to an embodiment of the invention;

DETAILED DESCRIPTION OF THE PREFERRED EMBODIMENTS

Figure 2:
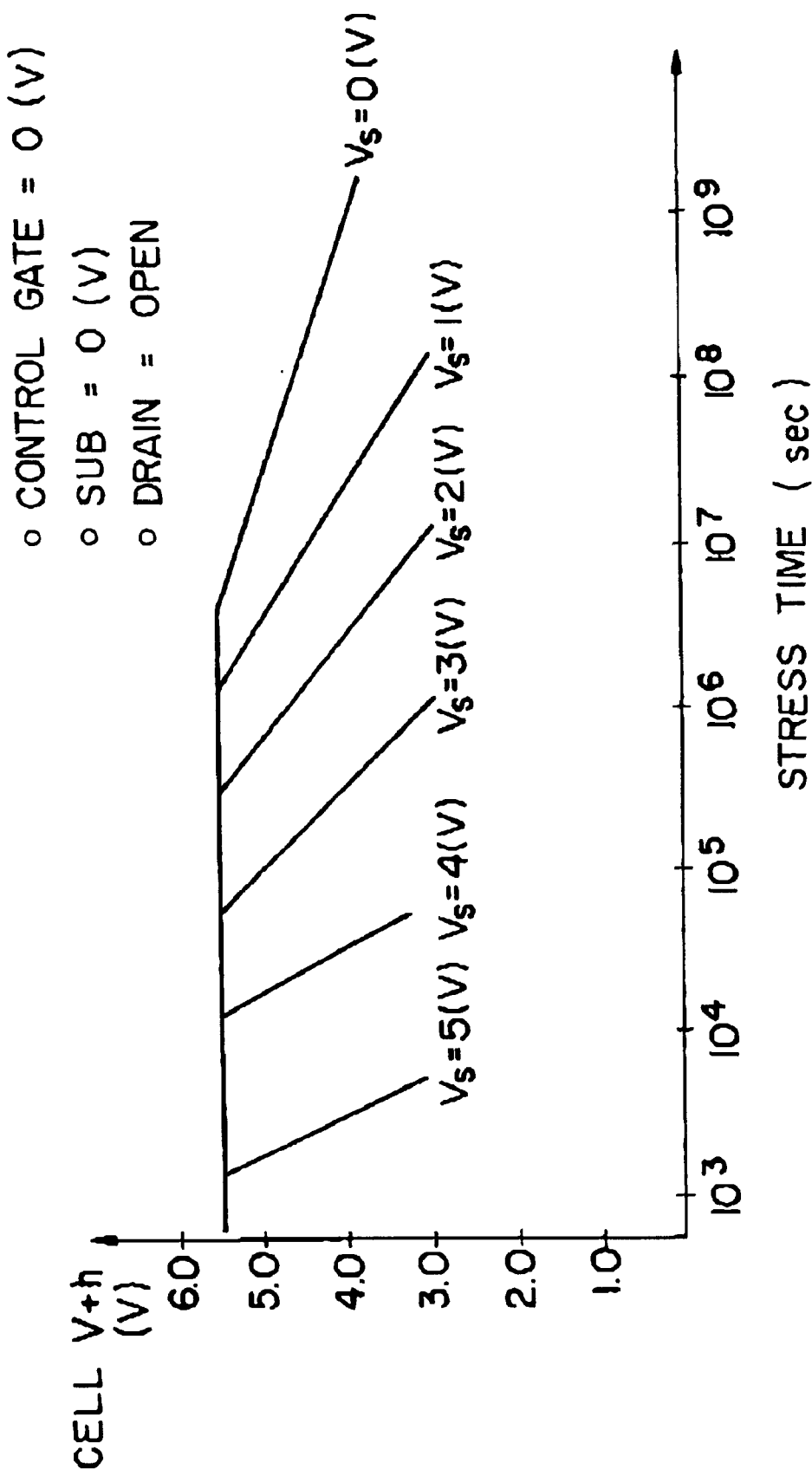
FIG. 2 is a characteristic diagram for evaluation of the semiconductor memory device shown in FIG. 1.
Figure 3A:
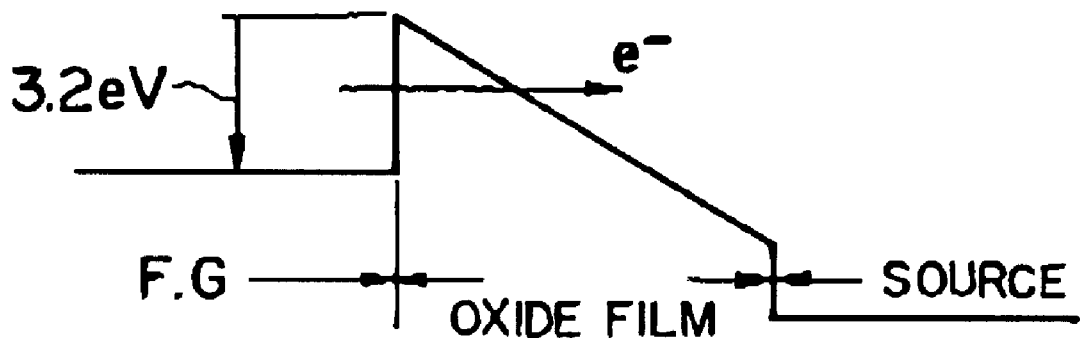
FIG. 3A is an explanatory diagram showing an aspect of the barrier formed by an oxide film between a floating gate (FG) and a source when no hole trap exists in the oxide film.
Figure 3B:
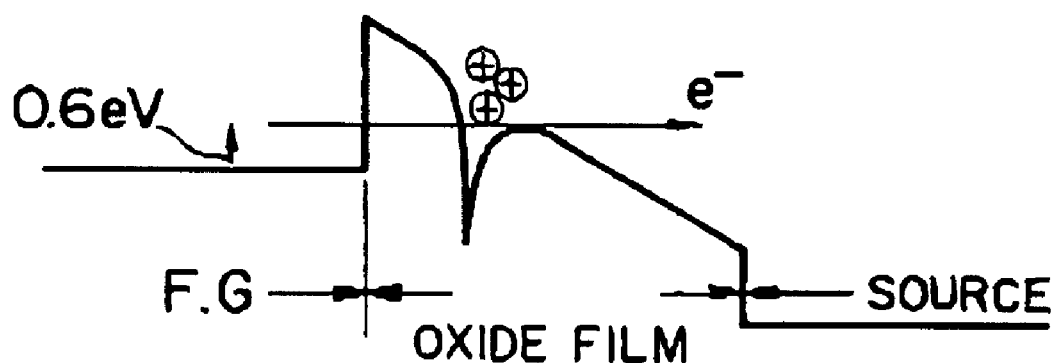
FIG. 3B is an explanatory diagram showing an aspect of the barrier formed by the oxide film between the floating gate (FG) and the source when a hole trap exists in the oxide film.

An embodiment of the invention is described below with reference to the drawings.

FIG. 1 is a fragmentary cross-sectional view showing cells in a semiconductor memory device according to the embodiment. Shown in the drawing are two EEPROM cells. Formed on a front surface of a p-type silicon substrate 1 are an n'-type source region 2, and n'-type drain regions 3 and 4 located at opposite sides of the n'-type region 2. A floating gate 6 is provided above a channel-forming region of the substrate 1 between the source region 2 and the drain region 3 or 4 via a thin gate oxide film 51 permitting a tunneling, and a control gate 8 is formed above the floating gate 6 via an insulation film 52. Similarly, a floating gate 7 is formed above a channel-forming region of the substrate between the source region 2 and the drain region 4 via the gate oxide film 51, and a control gate 9 is formed above the floating gate 7 via the insulation film 52. The entire structure of these elements is covered by an oxide film 5 that is integral with the gate oxide film 51 and the insulation film 52.

Formed in the insulation film 5 are a contact hole 10 for access to the drain region 3 and another contact hole 11 for access to the drain region 4, both filled with drain outlet electrodes 12, 13.

On the other hand, the source region 2 is connected to a switching circuit 21 through a wiring (or interconnection) layer including contact electrodes and others not shown. The switching circuit 21 outputs a voltage to the source, which is switched between a value for the test mode and another value for the normal operative mode. Its normal side input terminal 24 is connected to a reference voltage source 27, and the other input terminal 23 for the test voltage is connected to a positive bias voltage source 26. A known transistor switch may be used for switching the input terminals under the control of a switch control signal introduced from a terminal 25. More specifically, when the switch control signal indicates the normal mode, connection is made through the normal side input terminal 24 to permit a reference voltage Vref to be applied to the source. When the switch control signal indicates the test mode, connection is made through the test side input terminal 23 to permit a voltage from the bias voltage source to be applied to the source. The bias voltage may be valued, for example, from 1V to 7V.

Explained below are behaviors of the nonvolatile semiconductor memory device.

For writing data, hot electrons are injected to the floating gates 6, 7 by applying a high voltage to the control gates 8, 9 and the drain regions 3, 4.

For normal data erasure, which is made by discharging the electric charge from the floating gates 6, 7, the switch control signal is set for the normal mode to connect the switching circuit 21 through the normal side input terminal 24 such that the high voltage Vref from the reference voltage source 27 is applied to the source region 2. At the same time, the control gates 8, 9 are set to a ground or negative voltage. As a result, a tunneling current flows in the oxide film 51, and electrons are removed from the floating gates 6, 7 to the source region 2, which results in erasure of data.

On the other hand, for erasure of data for an operation test, the switch control signal to the terminal 25 is set for the test mode to connect the switching circuit 21 through the test side input terminal 24 such that a high voltage Vs from the bias voltage source 26 is applied to the source region 2. At the same time, the control gates 8, 9 are set to a ground or negative voltage. As a result, a tunneling current flows in the oxide film 51, and electrons are removed from the floating gates 6, 7 to the source region 2, which results in erasure of data. Although the embodiment uses the bias voltage source 26 to produce the bias voltage, the reference voltage source 14 may be commonly used to generate the bias voltage by resistive division of the reference voltage. Another alternative is to supply the bias voltage from another external electric source.

Next explained is a test for finding defective cells in the construction of cells explained above.

For example, the control gate 8 is supplied with OV, the semiconductor substrate 1 with OV, the drain diffusion layer 3 is set open, and a voltage less than Vth from the bias voltage source 26 is applied as the source voltage Vs to the source 2 so as to stress the oxide film 51. These features create a status where a self-field is falsely applied between the floating gate 6 and the source region 2. In this status, the threshold voltage Vth is measured at appropriate times. In cells that captured holes in the tunneling oxide film 51 through repeated write and erase operations and became liable to lose electrons from the floating gate by tunneling, the flow of electrons is accelerated by a voltage applied to the source, and the threshold voltage drops in a short time. Therefore, defective cells can be quickly found out and can be reliably rejected.

FIG. 2 shows the nature of acceleration of data retention in the EEPROM, taking the stress time (sec) along the horizontal axis and the threshold voltage Vth (V) along the vertical axis. It is known from FIG. 2 that the threshold voltage Vth tends to decrease with increase in voltage of the source diffusion layer from 0V to 5V; in other words, it is possible to screen out in a short time the cells in which electrons slip out from the floating gate 42.

It is also known from FIG. 2 that, as the voltage applied to the floating gate and the source region increases, the inclination of the line becomes acute and makes it easier to find out defective cells in a short time. Therefore, the source voltage Vs for the test mode is desired to be as high as possible.

However, as the source voltage Vs for the test mode approaches Vth, there arises the risk that cells come to represent the same status as that for erasure. Taking it into consideration, the source voltage Vs is preferably lower than the voltage for erasure.

In the above-mentioned embodiment, a p-type substrate and n-type source/drain regions are explained. However, opposite conductivities can also be applicable.

As described above, according to the invention, the storage device creates, in its test mode, a status where a self-field is falsely applied between the floating gate and the source region to measure the threshold voltage from time to time. Therefore, cells with holes captured in the tunneling oxide film and liable to lose electrons from the floating gates due to tunneling can be rejected in a short time, and the entire reliability of the device can be improved.

What is claimed is:

1. A nonvolatile semiconductor memory device capable of electrical writing and erasure, comprising:

a source region and a drain region formed on a front surface of a substrate at locations separated by a channel region;

a floating gate formed above said channel region via a thin oxide film;

a control gate formed above said floating gate via an insulation film; and a switching circuit for selectively supplying said source region with one of a reference high voltage during a normal erase mode and a test bias voltage during a test mode;

wherein said test bias voltage is greater than 0 volts and lower than said reference high voltage, and wherein said memory device, during said test mode, creates a status where a self-field is applied between said floating gate and said source so that cells that are deteriorated due to trapping of holes in said oxide film are detected by measuring a threshold voltage of said memory device.

2. The nonvolatile semiconductor memory device according to claim 1, wherein said test bias voltage is less than the threshold value of said memory device.

3. The nonvolatile semiconductor memory device according to claim 1, wherein said switching circuit switches said voltages under the control of a switch control signal that is externally supplied.

4. The nonvolatile semiconductor memory device according to claim 1, wherein said switching circuit and memory cells are formed on a common substrate.

* * * * *